United States Patent
Ichiki

(10) Patent No.: US 8,884,435 B2
(45) Date of Patent: Nov. 11, 2014

(54) SEMICONDUCTOR DEVICE

(75) Inventor: Hidehiko Ichiki, Miyazaki (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 217 days.

(21) Appl. No.: 12/801,747

(22) Filed: Jun. 23, 2010

(65) Prior Publication Data

US 2010/0327458 A1    Dec. 30, 2010

(30) Foreign Application Priority Data

Jun. 26, 2009  (JP) ................. 2009-152793

(51) Int. Cl.
| | | |
|---|---|---|
| H01L 23/48 | (2006.01) | |
| H01L 23/52 | (2006.01) | |
| H01L 29/40 | (2006.01) | |
| H01L 23/528 | (2006.01) | |

(52) U.S. Cl.
CPC .................... *H01L 23/528* (2013.01)
USPC ........................................................ 257/773

(58) Field of Classification Search
CPC ... H01L 23/528; H01L 21/4885; H01L 24/42; H01L 24/44; H01L 24/45; H01L 23/52
USPC ................. 257/773, 784, E23.024, E23.025, 257/E23.036, E23.068, E23.105, E23.141, 257/E21.627
See application file for complete search history.

(56) References Cited

U.S. PATENT DOCUMENTS

| | | | |
|---|---|---|---|
| 2003/0202800 A1* | 10/2003 | Matsushima et al. | 398/200 |
| 2004/0021227 A1* | 2/2004 | Watanabe | 257/773 |
| 2005/0287800 A1* | 12/2005 | Katase et al. | 438/652 |
| 2009/0224373 A1* | 9/2009 | Matsuda | 257/632 |

FOREIGN PATENT DOCUMENTS

| | | | |
|---|---|---|---|
| JP | 2-139931 | | 5/1990 |
| JP | 05-121733 | * | 5/1993 |
| JP | 05-218021 A | | 8/1993 |
| JP | 10-163210 | | 6/1998 |
| JP | 2003-31860 | * | 7/2003 |
| JP | 2004-134594 | | 4/2004 |
| JP | 2008-306103 | | 12/2008 |
| JP | 2009-212262 | | 9/2009 |

* cited by examiner

*Primary Examiner* — Jae Lee
*Assistant Examiner* — Quovaunda V Jefferson
(74) *Attorney, Agent, or Firm* — Rabin & Berdo, P.C.

(57) ABSTRACT

There is provided a semiconductor device including: a metal wiring line formed on a semiconductor substrate; an inside chamfer provided only at the inside of a bend in the metal wiring line, widening the wiring line width at the inside of the bend; and a protection film covering the metal wiring line.

7 Claims, 3 Drawing Sheets

SEMICONDUCTOR DEVICE

CROSS-REFERENCE TO RELATED APPLICATION

This application is based on and claims priority under 35 USC 119 from Japanese Patent Application No. 2009-152793 filed on Jun. 26, 2009, the disclosure of which is incorporated by reference herein.

BACKGROUND

1. Technical Field

The present invention relates to a semiconductor device with a metal wiring line.

2. Related Art

Technology is described in Japanese Patent Application Laid-Open (JP-A) No. 5-218021 to suppress cracks from occurring in a passivation protection film for protecting metal wiring lines.

More precisely, in this technology a configuration is adopted that spreads the stress that occurs in a passivation protection film for protecting metal wiring, by making the angles formed on the inside and the outside of a bend of a metal wiring line formed on a semiconductor substrate less acute (see FIG. 2B of JP-A No. 5-218021), thereby suppressing cracks from occurring.

However, with conventional metal wiring lines, the wiring line width of the bend is narrowed in order to make the angles formed on the inside and the outside of a bend in a metal wiring line less acute.

When the wiring line width is narrowed, the coating width of resist for patterning the wiring line becomes narrower. In addition, as the coating width of the resist becomes narrower the amount of resist also decreases, and a taper profile on the resist profile becomes weakened (the side face lifts up). Therefore, the taper profile on the side face of the patterned metal wiring line (metal etching profile) also becomes weakened (the side face lifts up). Due to weakening of the taper profile of the side face of the metal wiring line, the film thickness of the passivation protection film coving this location becomes thinner, with a concern arising of a reduction in the covering properties of the passivation protection film.

SUMMARY

The present invention is made in consideration of the above circumstances and raises the covering properties of a protection film for protecting metal wiring lines.

According to the first aspect of the present invention, there is provided a semiconductor device including:

a metal wiring line formed on a semiconductor substrate;

an inside chamfer provided only at the inside of a bend in the metal wiring line, widening the wiring line width at the inside of the bend; and a protection film covering the metal wiring line.

According to the above configuration, the metal wiring line provided with the bend is formed on the semiconductor substrate, and the inside chamfer is provided only at the inside of the bend in the metal wiring line, widening the wiring line width at the inside of the bend.

By widening the wiring line width of the bend, the coating width of resist for patterning the wiring line is widened. The amount of resist is increased by widening the coating width of resist, strengthening the taper profile of the resist profile (the side face does not lift up). Due thereto, since the taper profile of the side face of the patterned metal wiring line (metal etching profile) is also strengthened (the side face does not lift up), the film thickness of the passivation protection film covering the bend is made thicker.

By strengthening the taper profile of the side face of the metal wiring line in this manner, since the film thickness of the protection film covering this location is made thicker, the covering properties of the protection film protecting the metal wiring can be raised.

According to the second aspect of the present invention, there is provided the semiconductor device of the first aspect, wherein the inside chamfer comprises an edge that connects a first side at the inside of the metal wiring line, to another side provided at the inside of the metal wiring line at the opposite side of the bend to the first side, with a straight line.

According to the above configuration, the edge of the inside chamfer is formed connecting the first side at the inside of the metal wiring line, to the other side thereof at the opposite side of the bend to the first side, with a straight line. The inside chamfer can be easily formed in this manner by connecting the first edge with the other edge with a straight line.

According to the third aspect of the present invention, there is provided the semiconductor device of the first aspect, wherein the inside chamfer comprises an edge that connects a first side at the inside of the metal wiring line, to another side provided at the inside of the metal wiring line at the opposite side of the bend to the first side, with a curved line.

According to the above configuration, the edge of the inside chamfer is formed connecting the first side at the inside of the metal wiring line, to the other side thereof at the opposite side of the bend to the first side, with a curved line. By making the edge of the inside chamfer connecting the first edge with the other edge a curved line in this manner, concentration of stress, occurring at the edge in particular locations, can be alleviated.

According to the fourth aspect of the present invention, there is provided a semiconductor device including:

a first metal wiring line formed on a semiconductor substrate and provided with a first bend;

a second metal wiring line formed on the semiconductor substrate at the inside of, and parallel to, the first metal wiring line, the second metal wiring line being provided with a second bend that is disposed at the inside of the first bend and comprises an outside chamfer narrowing the wiring line width at the outside of the second bend; and a protection film covering the first metal wiring line and the second metal wiring line.

According to the above configuration, the first metal wiring line provided with the first bend is formed on the semiconductor substrate, and the second metal wiring line is formed on the semiconductor substrate at the inside of, and parallel to, the first metal wiring line. The second metal wiring line is provided with the second bend disposed at the inside of the first bend. The outside chamfer narrows the wiring line width at the outside of the second bend.

By narrowing the wiring line width at the outside of the second bend using the outside chamfer, the separation between the first bend and the second bend is widened. By widening the separation between the first bend and the second bend, the amount of CVD gas, flowing between the first bend and the second bend in order to form the protection film, increases. By increasing the amount of CVD gas flowing between the first bend and the second bend, the film thickness of the protection film, generated by reaction of the CVD gas, increases.

By widening the separation between the first bend and the second bend in this manner, due to the increase in the amount of CVD gas flowing therebetween and the thicker film thickness of the protection film, the covering properties of the protection film protecting the metal wiring lines can be raised.

According to the fifth aspect of the present invention, there is provided the semiconductor device of the fourth aspect, wherein the outside chamfer comprises an edge that connects a first side at the outside of the second metal wiring line, to another side at the outside of the second metal wiring line at the opposite side of the bend to the first side, with a straight line.

According to the above configuration, the edge of the outside chamfer is formed connecting a first side at the outside of the second metal wiring line, to another side thereof at the opposite side of the bend to the first side, with a straight line. The outside chamfer can thereby be easily formed by connecting the first side to the other side with a straight line.

According to the sixth aspect of the present invention, there is provided the semiconductor device of the fourth aspect, wherein the outside chamfer comprises an edge that connects a first side at the outside of the second metal wiring line, to another side at the outside of the second metal wiring line at the opposite side of the bend to the first side, with a curved line.

According to the above configuration, the edge of the outside chamfer is formed connecting a first side at the outside of the second metal wiring line, to another side at thereof at the opposite side of the bend to the first side, with a curved line. By making the edge of the outside chamfer connect the first edge with the other edge in a curved line in this manner, concentration of stress, occurring at the edge in particular locations, can be alleviated.

According to the present invention, the covering properties of a protection film for protecting a metal wiring line can be raised.

BRIEF DESCRIPTION OF THE DRAWINGS

Exemplary embodiments of the present invention will be described in detail based on the following figures, wherein.

DETAILED DESCRIPTION

Explanation follows of an example of a semiconductor device 10 according to a first exemplary embodiment of the present invention, with reference to FIG. 1 and FIGS. 2A to 2D.

Configuration

Figure 1:
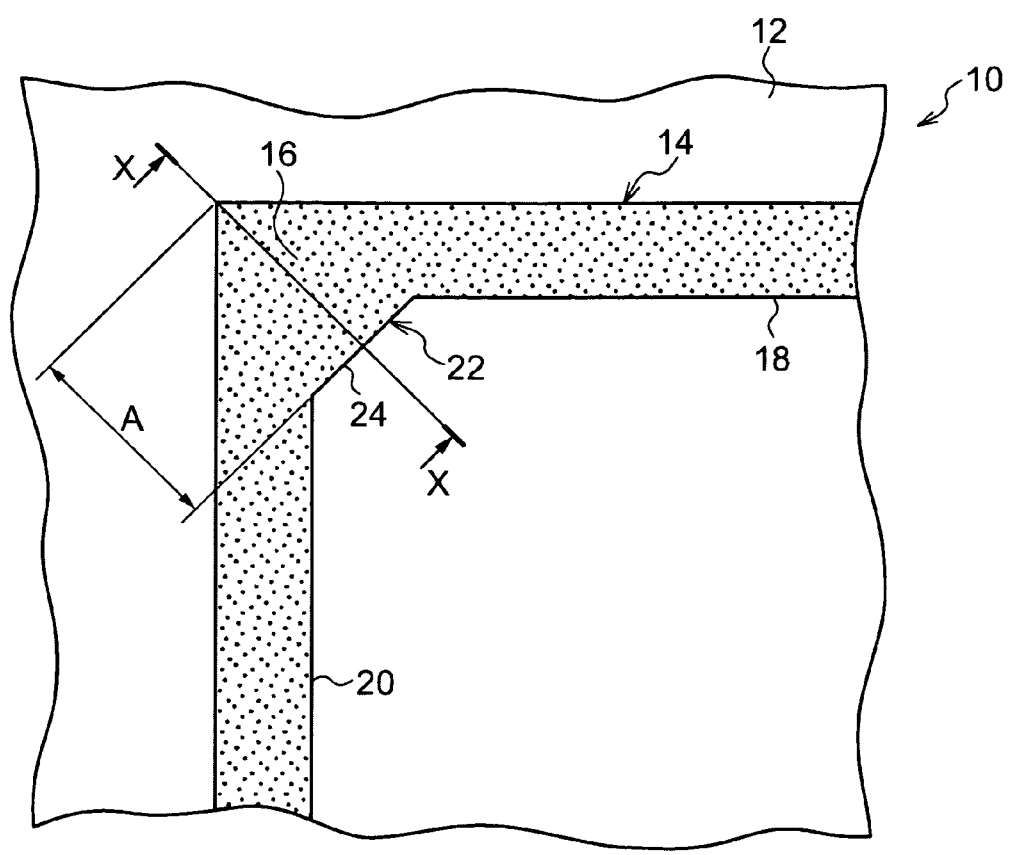
FIG. 1 is a plan view showing a metal wiring line employed in a semiconductor device according to a first exemplary embodiment of the present invention.

As shown in FIG. 1, a metal wiring line 14, patterned from an Al—Si metal alloy layer 28 (see FIG. 2A), and a bonding pad pattern (not shown in the figures) electrically connected to a semiconductor circuit by the metal wiring line 14, are formed on a semiconductor substrate 12 provided to the semiconductor device 10.

A bend 16, changing the extending direction of the metal wiring line 14, is provided to the metal wiring line 14, and the extending direction of the metal wiring line 14 is changed by 90 degrees due to the bend 16. In other words, the metal wiring line 14 is configured to extend in orthogonal directions on either side of the bend 16.

An inside chamfer 22 is also provided at the inside of the bend 16, widening the wiring line width of the bend 16 (dimension A shown in FIG. 1). The inside chamfer 22 is provided with an edge 24 that connects together a first side 18 of the inside of the metal wiring line 14 at one side of the bend 16, with another side 20 thereof, at the opposite side of the bend 16 to that of the first side 18, with a straight line. In the present exemplary embodiment, 135 degree angles are formed between the edge 24 and the first side 18, and the edge 24 and the side 20.

A passivation protection film 26 (see FIG. 2D) is also provided as a protection film on the metal wiring line 14, in order to prevent external stress, and penetration of water and mobile ions from outside.

Figure 2A:
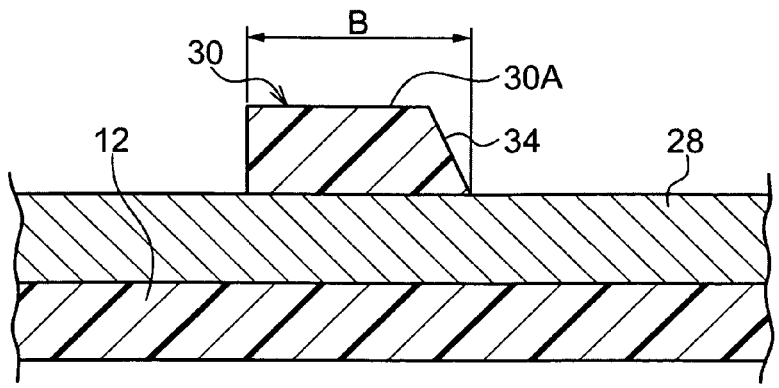
FIG. 2A to FIG. 2D are process diagrams showing processes in the fabrication of a metal wiring line employed in a semiconductor device according to the first exemplary embodiment of the present invention.

Explanation follows of the sequence of forming the passivation protection film 26. FIG. 2A to FIG. 2D show the cross-section X-X of FIG. 1. First, as shown in FIG. 2A, a resist layer is coated on the metal alloy layer 28 formed by a sputtering method on the semiconductor substrate 12, and a patterned resist 30 is formed by patterning the resist layer using a photolithographic process.

Figure 2B:
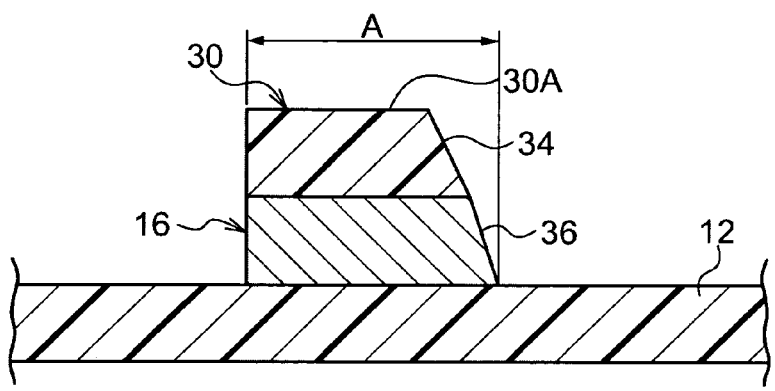

Next, by an etching process, as shown in FIG. 2B, the metal alloy layer 28 is subjected to etching while employing the resist 30, and the patterned metal wiring line 14 is formed.

Figure 2C:
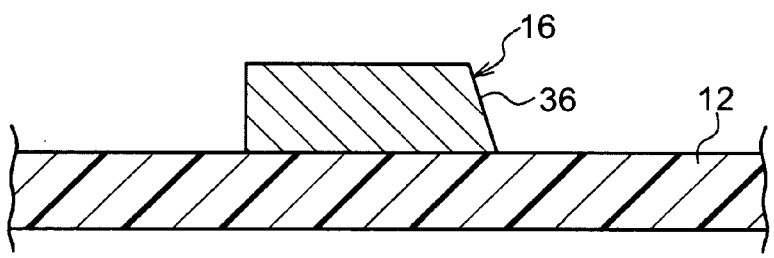

Next, as shown in FIG. 2C, the resist 30 employed in the etching process is removed using, for example, a chemical, or the like.

Figure 2D:
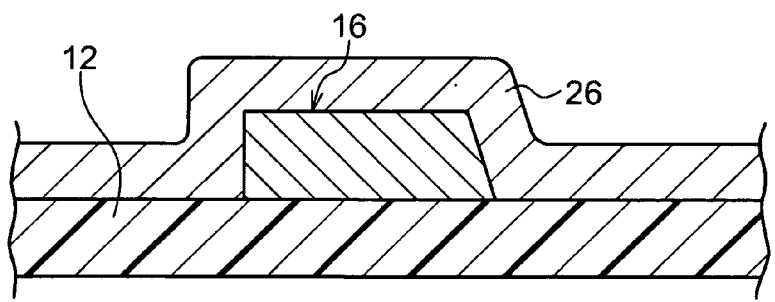

Next, as shown in FIG. 2D, the passivation protection film 26 is formed so as to cover the metal wiring line 14 by supplying a flow of CVD gas (for example a silane gas) and using plasma discharge. Note that, for example, a PSG film, a silicon nitride film, or the like can be employed as the passivation protection film 26.

Operation and Effect

As described above, as shown in FIG. 1, the inside chamfer 22 is provided, with widened wiring line width at the bend 16 in the metal wiring line 14. As shown in FIG. 2A, the coating width dimension (dimension B in the figure) of the resist 30 for patterning the bend 16 is widened in order to form the wide wiring line width metal wiring line 14 provided with the inside chamfer 22.

As shown in FIG. 2A, when the coating width dimension of the resist 30 is widened, the amount of the resist 30 for patterning the bend 16 increases. When the amount of the resist 30 is increased, since the shrinkage amount by which the top face 30A of the resist 30 shrinks in the width direction (the left-right direction in FIG. 2A) increases, the taper profile of a resist profile 34 is strengthened (the side face does not lift up).

As shown in FIG. 2B, in the etching process, since the taper profile (metal etching profile) of the side face 36 of the metal wiring line 14, from etching the metal alloy layer 28 along the taper profile of the resist profile 34, is also strengthened (the side face does not lift up), the thickness of the film thickness of the passivation protection film covering the bend is made thicker.

In this manner, by strengthening the taper profile of the side face 36 of the metal wiring line 14, since the film thickness of the passivation protection film 26 covering this location is thickened, the covering properties (coverage) of the passivation protection film 26 for protecting the metal wiring line 14 can also be raised.

By raising the covering properties (coverage) of the passivation protection film 26, generation of, for example, cracks, pin holes, and the like, occurring in the passivation protection film 26, can be suppressed.

Furthermore, by suppressing the generation of cracks, pin holes, and the like, occurring in the passivation protection film 26, fluctuations in the properties of the element due to water and mobile ions penetrating into such cracks, and the like, can be prevented.

Furthermore, the edge 24 of the inside chamfer 22 is formed by connecting the first side 18 of the inside of the metal wiring line 14 at one side, with the other side 20 thereof at the opposite side of the bend 16 to that of the first side 18, with a straight line. The inside chamfer 22 can thereby be easily formed by straight-line connecting the first side 18 and the other side 20.

Note that while detailed explanation has been given of a particular exemplary embodiment of the present invention, embodiments of the present exemplary embodiment are not limited thereto, and it is apparent to a person of ordinary skill in the art that various other embodiments are possible within the scope of the present invention. For example, in the above exemplary embodiment, the edge 24 of the inside chamfer 22 is a straight line, however there is no particular limitation to a straight line and a curved line may be employed. When such a curved line is employed, concentration of stress, occurring at the edge in particular locations, can be alleviated.

Furthermore, in the above exemplary embodiment, the extending direction of the metal wiring line 14 changes by 90 degrees due to the bend 16, however there is no particular limitation to 90 degrees, and angles of less than 90 degrees, and angles of greater than 90 degrees, are also applicable.

Figure 3A:
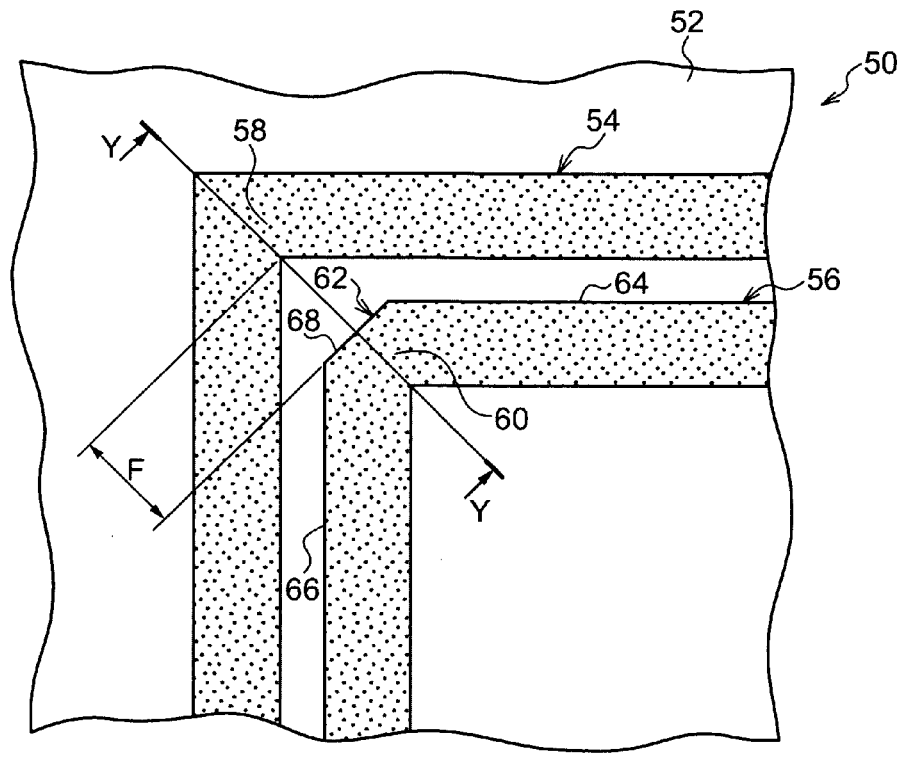
FIG. 3A and FIG. 3B are respectively a plan view and a cross-section of metal wiring lines employed in a semiconductor device according to a second exemplary embodiment of the present invention.
Figure 3B:
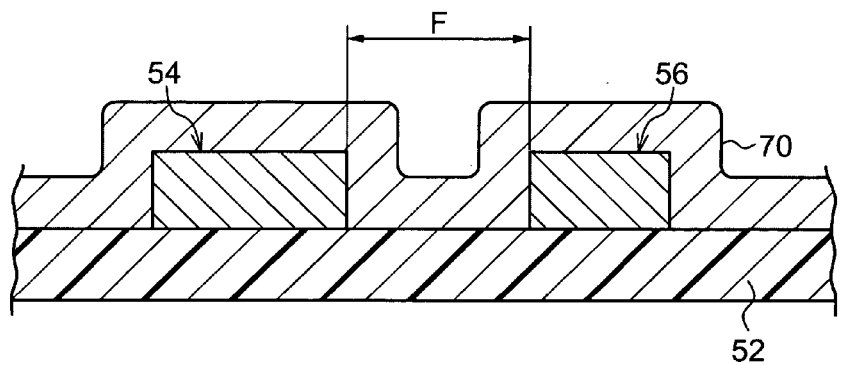

Explanation follows next of an example of a semiconductor device 50 according to a second exemplary embodiment of the present invention, with reference to FIG. 3A and FIG. 3B. Note that similar parts to those of the first exemplary embodiment are allocated the same reference numerals and explanation thereof is abbreviated.

Configuration

As shown in FIG. 3A, a first metal wiring line 54 and a second metal wiring line 56 patterned from an Al—Si metal alloy layer, and a bonding pad pattern (not shown in the figures) electrically connected to a semiconductor circuit by the first metal wiring line 54 and the second metal wiring line 56, are formed on a semiconductor substrate 52 provided to the semiconductor device 50.

A first bend 58, changing the extending direction of the first metal wiring line 54, is provided to the first metal wiring line 54, and the extending direction of the first metal wiring line 54 is changed by 90 degrees due to the first bend 58. In other words, the first metal wiring line 54 is configured to extend in orthogonal directions on either side of the first bend 58.

A second bend 60 is provided, formed parallel at the inside of the first metal wiring line 54 and disposed at the inside of the first bend 58. The second metal wiring line 56 is configured, similarly to the first bend 58, so as to extend in orthogonal directions on either side of the second bend 60.

An outside chamfer 62 is provided to the second metal wiring line 56, at the outside of the second bend 60, narrowing the wiring line width of the bend 60. The outside chamfer 62 is provided with an edge 68 that connects a first side 64 of the outside of the second metal wiring line 56 at one side, with another side 66 thereof at the opposite side of the second bend 60 to that of the first side 64, with a straight line. In the present exemplary embodiment, 135 degree angles are formed between the edge 68 and the first side 64, and the edge 68 and the side 66.

In such a configuration, if the separation between the first metal wiring line 54 and the second metal wiring line 56 is 1 (arbitrary unit), then if the outside chamfer 62 had not been provided then the separation between the first bend 58 and the second bend 60 would have been 1.4, however, since the outside chamfer 62 has been provided to the second bend 60, the separation between the first bend 58 and the second bend 60 (dimension F of FIG. 3A and FIG. 3B), is wider than 1.4 (i.e., a ratio of the separation between the first and second bends 58, 60 to the separation between the metal wiring lines 54, 56 outside the bends 58, 60 is 1:a number greater than 1.4).

Operation and Effect

By widening the separation between the first bend 58 and the second bend 60, as explained above, the amount of CVD gas, flowing between the first bend 58 and the second bend 60 in order to form a passivation protection film 70 for protecting the first metal wiring line 54 and the second metal wiring line 56 (see FIG. 3B), increases. By increasing the amount of CVD gas flowing between the first bend 58 and the second bend 60, the film thickness of the passivation protection film 70, generated by reaction with the CVD gas, is increased.

By widening the separation between the first bend 58 and the second bend 60 in this manner, since the amount of the CVD gas flowing therebetween is increased and the film thickness of the passivation protection film 70 is made thicker, the covering properties (coverage) of the passivation protection film 70, protecting the first metal wiring line 54 and the second metal wiring line 56, can be raised.

Furthermore, by raising the covering properties (coverage) of the passivation protection film 70, the generation of, for example, cracks, pin holes, and the like, occurring in the passivation protection film 70 can be suppressed.

By suppressing the generation of, for example, cracks, pin holes, and the like, occurring in the passivation protection film 70, fluctuations in the properties of the element, due to water and mobile ions penetrating into such cracks, can be prevented.

The edge 68 of the outside chamfer 62 is formed by connecting the first side 64 of the outside of the second metal wiring line 56 at one side, with the other side 66 thereof at the opposite side of the second bend 60 to that of the first side 64, using a straight-line. The outside chamfer 62 can thereby be simply formed by connecting the first side 64 and the side 66 with a straight line.

Note that while detailed explanation has been given of a particular exemplary embodiment of the present invention, embodiments of the present exemplary embodiment are not limited thereto, and it is apparent to a person of ordinary skill in the art that various other embodiments are possible within the scope of the present invention. For example, in the above exemplary embodiment, the edge 68 of the outside chamfer 62 is a straight line, however there is no particular limitation to a straight line and a curved line may be employed. When such a curved line is employed, concentration of stress, occurring at the edge in particular locations, can be alleviated.

What is claimed is:

1. A semiconductor device comprising:
   a semiconductor substrate;
   a metal wiring line formed on the semiconductor substrate, the metal wiring line having a bend that includes an inside portion and an outside portion disposed opposite the inside portion, a surface of the outside portion forming a first angle with the substrate, a surface of the inside portion forming a second angle with the substrate, each of the first and second angles being measured in a direction that is within the metal wiring line, the first angle being larger than the second angle;

an inside chamfer provided only at the inside portion of the bend in the metal wiring line, a wiring line width being measured along a direction that is perpendicular to the chamfer and from the inside portion to the outside portion, the wiring line width widening towards a center of the bend, the inside chamfer having a straight line shape; and a protection film covering the metal wiring line.

2. The semiconductor device of claim 1, wherein the inside chamfer comprises an edge that connects a first side at the inside of the metal wiring line, to another side provided at the inside of the metal wiring line at the opposite side of the bend to the first side.

3. The semiconductor device of claim 1, wherein the inside chamfer is an edge that connects a first side of the metal wiring line to a second side of the metal wiring line at the opposite side of the bend to the first side, a point of intersection between the first side and the second side being on a chamfer line that is perpendicular to the chamfer, the chamfer line intersecting the center of the bend.

4. The semiconductor device of claim 3, wherein the first side and the second side are perpendicular to each other.

5. A semiconductor device comprising:

a semiconductor substrate;

a metal wiring line formed on the semiconductor substrate and having a bend, the bend including a bent wiring portion and a chamfer provided inside of the bent wiring portion, wherein at the bend an outside surface of the metal wiring line forms a first angle with the substrate, an inside surface of the metal wiring line forms a second angle with the substrate, each of the first and second angles being measured in a direction that is within the metal wiring line, and the first angle is larger than the second angle; and a protection film covering the metal wiring line.

6. The semiconductor device according to claim 5, wherein the inside surface is the chamfer, and the outside surface is disposed opposite the inside surface.

7. The semiconductor device according to claim 1, wherein the surface of the inside portion is the chamfer, and the surface of the outside portion is disposed opposite the chamfer.

* * * * *